(12) United States Patent
Shigematsu et al.

(10) Patent No.: US 12,288,119 B2
(45) Date of Patent: Apr. 29, 2025

(54) COIL COMPONENT

(71) Applicant: Murata Manufacturing Co., Ltd., Nagaokakyo (JP)

(72) Inventors: Satoshi Shigematsu, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 73 days.

(21) Appl. No.: 18/382,612

(22) Filed: Oct. 23, 2023

(65) Prior Publication Data
US 2024/0046063 A1 Feb. 8, 2024

Related U.S. Application Data

(63) Continuation of application No. PCT/JP2022/018739, filed on Apr. 25, 2022.

(30) Foreign Application Priority Data

May 18, 2021 (JP) .................................. 2021-083940

(51) Int. Cl.
*G06K 19/077* (2006.01)
*H01F 17/00* (2006.01)

(52) U.S. Cl.
CPC . *G06K 19/07784* (2013.01); *G06K 19/07722* (2013.01); *G06K 19/07781* (2013.01); *H01F 17/0013* (2013.01)

(58) Field of Classification Search
CPC ....... G06K 19/07722; G06K 19/07781; G06K 19/07784; H03H 7/38; H03H 11/28; H01F 17/00; H01F 17/0013
See application file for complete search history.

(56) References Cited

U.S. PATENT DOCUMENTS

| | | | |
|---|---|---|---|
| 5,304,967 | A | 4/1994 | Hayashi |
| 2015/0214597 | A1 | 7/2015 | Nagai |
| 2016/0126921 | A1 | 5/2016 | Hur et al. |

FOREIGN PATENT DOCUMENTS

| | | |
|---|---|---|
| JP | H04355902 A | 12/1992 |
| JP | H10126191 A | 5/1998 |
| JP | H10200357 A | 7/1998 |
| JP | 2015164289 A | 9/2015 |
| JP | 2015228438 A | 12/2015 |
| JP | 2017534228 A | 11/2017 |
| WO | 2018198604 A1 | 11/2018 |

OTHER PUBLICATIONS

International Search Report in PCT/JP2022/018739, mailed Jul. 19, 2022, 3 pages.
Written Opinion in PCT/JP2022/018739, mailed Jul. 19, 2022, 3 pages.

*Primary Examiner* — Laura A Gudorf
(74) *Attorney, Agent, or Firm* — Keating & Bennett, LLP (57) ABSTRACT

A coil component includes coils in a multilayer body with a rectangular or substantially rectangular parallelepiped shape. The coil component includes outer electrodes, a first coil, and second coils. The first coil includes conductor patterns and via conductors. When the multilayer body is divided by a bisecting line into first and second regions in a longitudinal direction of the multilayer body when viewed in the stacking direction, the first coil is located in the first region. When viewed in the stacking direction, straight lines connecting the via conductors with a first outer electrode and a fourth outer electrode at a minimum distance cross an opening region of the first coil.

17 Claims, 8 Drawing Sheets

COIL COMPONENT

CROSS REFERENCE TO RELATED APPLICATIONS

This application claims the benefit of priority to Japanese Patent Application No. 2021-083940 filed on May 18, 2021 and is a Continuation application of PCT Application No. PCT/JP2022/018739 filed on Apr. 25, 2022. The entire contents of each application are hereby incorporated herein by reference.

BACKGROUND OF THE INVENTION

1. Field of the Invention

The present disclosure relates to a coil component.

2. Description of the Related Art

In recent years, electronic devices have become increasingly wireless and power consumption in electronic circuits has increased. In particular, RF circuits are known to consume large amounts of power for transmitting, receiving, and processing RF communication signals. Therefore, a circuit that uses a divider circuit has been proposed to reduce power consumption (e.g., Japanese Unexamined Patent Application Publication No. 2017-534228).

SUMMARY OF THE INVENTION

When a coil component including a coil, such as a divider circuit, is realized with a multilayer electronic component, parasitic capacitance is generated between a coil, capacitor, or the like and an electrode, depending on the arrangement of the coil, capacitor, or the like formed inside the multilayer electronic component. It is possible that a coil component with generated parasitic capacitance cannot obtain required characteristics.

Therefore, preferred embodiments of the present invention provide coil components that each achieve required or desired characteristics.

A coil component according to a preferred embodiment of the present disclosure is a coil component including a plurality of coils in a multilayer body with a rectangular or substantially rectangular parallelepiped shape. The coil component includes an outer electrode located at least partially at a side surface of the multilayer body, a first coil conductor with a winding axis extending in a stacking direction of the multilayer body, and a second coil conductor with a winding axis extending in the stacking direction and located at a position where the second coil conductor does not overlap the first coil conductor when viewed in the stacking direction. The first coil conductor includes a plurality of conductor patterns stacked with an insulating layer interposed therebetween, and a connecting conductor to electrically connect the plurality of conductor patterns. When the multilayer body is divided by a bisecting line into a first region and a second region in a longitudinal direction of the multilayer body when viewed in the stacking direction, the first coil conductor is located in the first region. When viewed in the stacking direction, a straight line connecting the connecting conductor with the outer electrode at a minimum distance crosses an opening region of the first coil conductor.

According to a preferred embodiment the present disclosure, when viewed in the stacking direction, the straight line connecting the connecting conductor with the outer electrode at a minimum distance crosses the opening region of the first coil conductor. Thus, the first coil conductor and the outer electrode can be separated and the parasitic capacitance generated between the first coil conductor and the outer electrode can be reduced to obtain the characteristics required for the coil component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following is a description of coil components according to preferred embodiments of the present invention.

Figure 1:
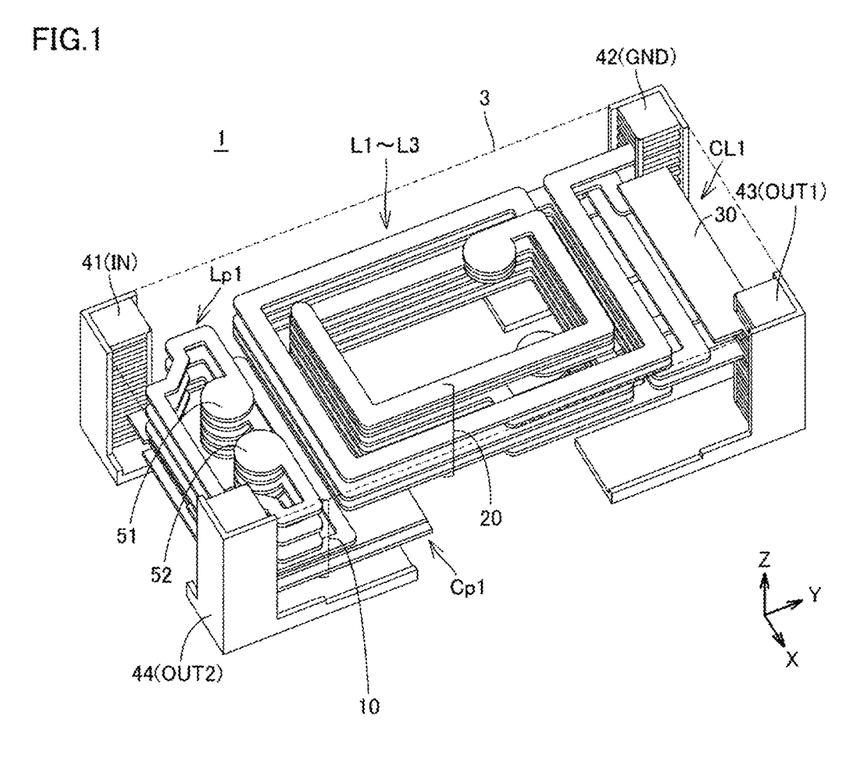
FIG. 1 is a perspective view of a coil component according to a preferred embodiment of the present invention.
Figure 2:
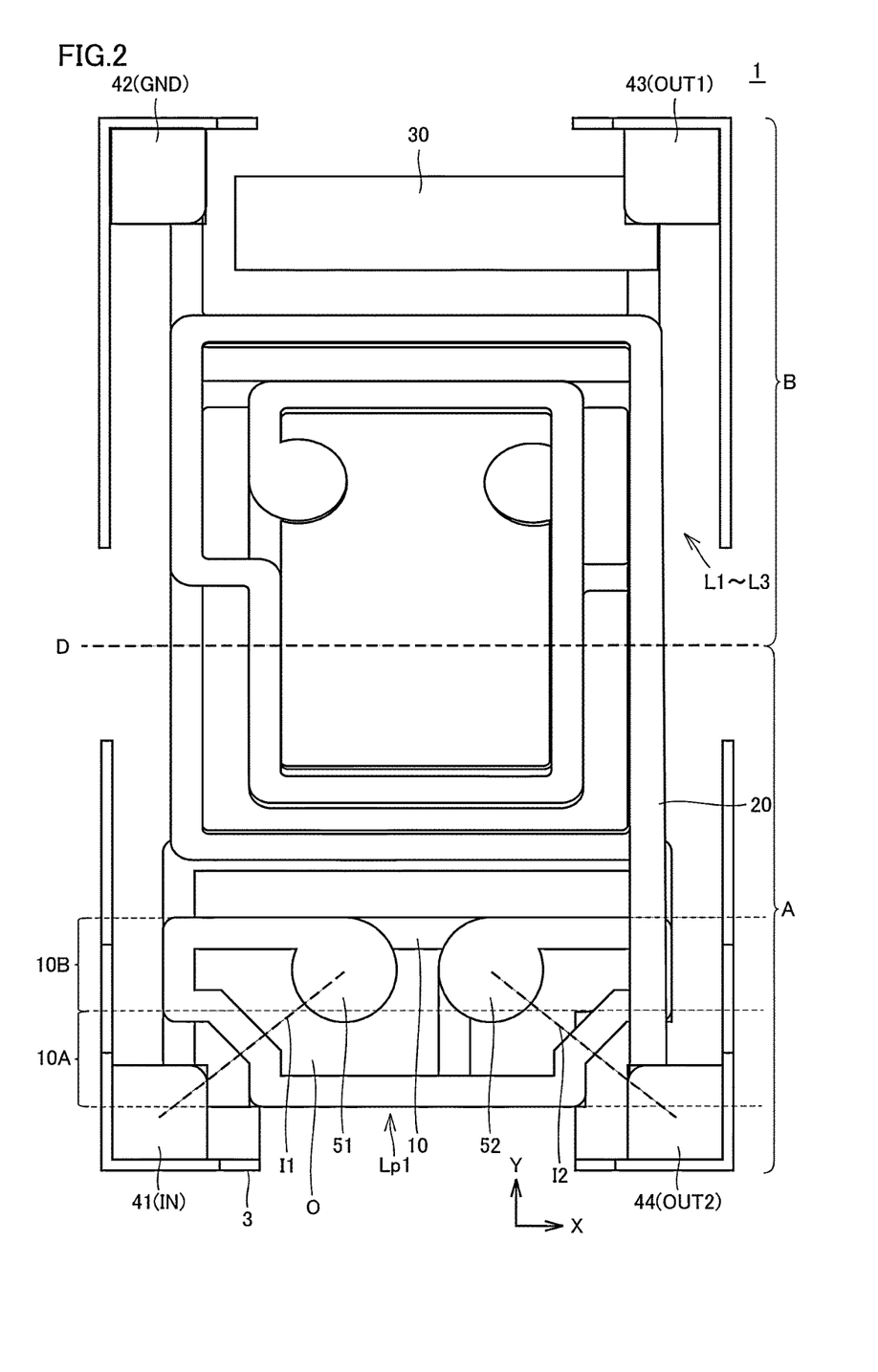
FIG. 2 is a plan view of a coil component according to a preferred embodiment of the present invention.
Figure 3:
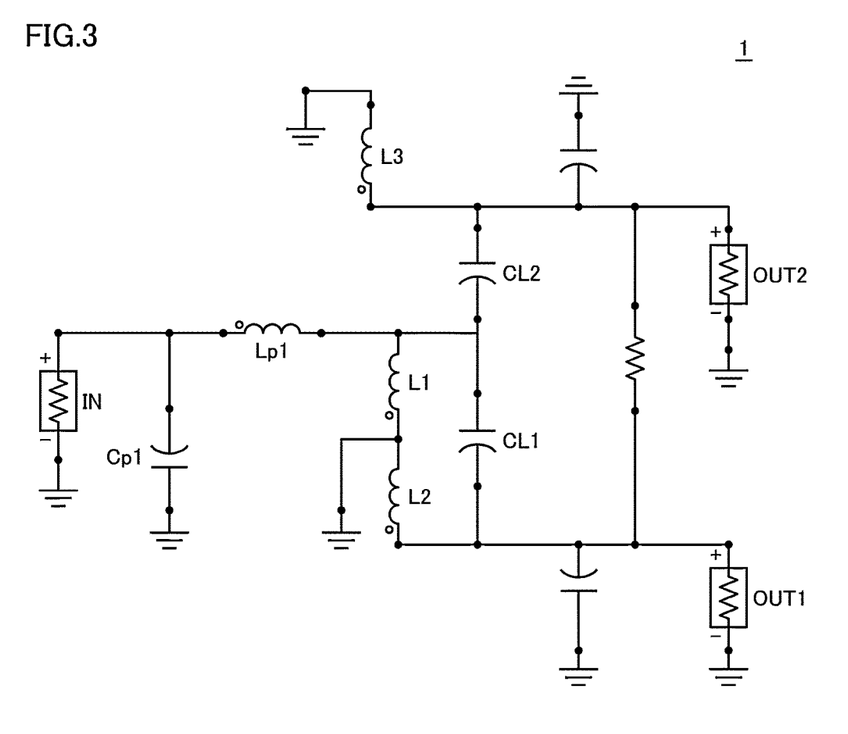
FIG. 3 is an equivalent circuit diagram of a coil component according to a preferred embodiment of the present invention.

First, coil components according to preferred embodiments of the present invention will be described with reference to the drawings. FIG. 1 is a perspective view of a coil component according to a preferred embodiment of the present invention. FIG. 2 is a plan view of a coil component according to a preferred embodiment of the present invention. FIG. 3 is an equivalent circuit diagram of a coil component according to a preferred embodiment of the present invention. Here, in FIGS. 1 and 2, the short-side direction of the coil component 1 is the X-direction, the long-side direction is the Y-direction, and the height direction is the Z-direction. The stacking direction of the substrates is in the Z-direction, and the direction of the arrow indicates the upper layer direction.

The coil component 1 is, for example, a divider circuit in which a first coil conductor that does not define a transformer and a second coil conductor that does define a transformer are arranged adjacent to each other. Although the following preferred embodiment is described using a divider circuit as the configuration of the coil component 1, a coil component including a plurality of coils in a multilayer body having a rectangular or substantially rectangular parallelepiped shape is not limited to a divider circuit, and a coil component with a similar configuration can be applied.

First, as illustrated in FIG. 3, the coil component 1 includes a capacitor Cp1 and a coil Lp1 (first coil conductor) that define an LC resonator, coils L1 to L3 (second coil conductor) that define a transformer unit, and capacitors CL1 and CL2. The coil component 1 includes the transformer unit connected subsequent to the LC resonator, which is connected to an input terminal IN, and has, subsequent to the transformer unit, an output terminal OUT1 connected to the capacitor CL1 and an output terminal OUT2 connected to the capacitor CL2.

The coil component 1 includes a multilayer body 3, in which a plurality of substrates with wiring for coils and capacitors are stacked as illustrated in FIGS. 1 and 2. The multilayer body 3 may be manufactured, for example, by a method including forming electrode patterns, etc., using photosensitive conductive paste and photosensitive insulating paste with a photomask. The multilayer body 3 may also be manufactured, for example, by a method including laminating ceramic green sheets using a process of forming an electrode pattern by screen printing and a process of drilling holes in an insulating layer with a laser and filling them with via electrodes. The multilayer body 3 includes a pair of main surfaces facing each other and side surfaces connecting the main surfaces. Inside of the multilayer body 3, a plurality of conductor patterns 10 of the capacitor Cp1 and the coil Lp1, which define an LC resonator, a plurality of conductor patterns 20 of the coils L1 to L3, which define a transformer unit, and a plurality of conductor patterns 30 of the capacitor CL1 are provided and stacked in the Z-direction. The capacitor CL2 is stacked on top of the coil Lp1 as described below, but is not illustrated in FIGS. 1 and 2.

A first outer electrode 41, which defines the input terminal IN, a second outer electrode 42, which defines a GND terminal, a third outer electrode 43, which defines the output terminal OUT1, and a fourth outer electrode 44, which defines the output terminal OUT2, are provided at the four corners of the multilayer body 3. The first outer electrode 41 to the fourth outer electrode 44 need not be provided at the four corners of the multilayer body 3, but need only be provided at the outer periphery of the multilayer body 3. The number of outer electrodes provided at the outer periphery of the multilayer body 3 is not limited to four, but need only be plural.

The coil Lp1 is provided near the first outer electrode 41 and the fourth outer electrode 44, and has a winding axis extending in the stacking direction. The capacitor Cp1 is provided in the lower layer portion of the plurality of conductor patterns 10, and the coil Lp1 is provided in the upper layer portion. Via conductors 51 and 52 (connecting conductors) are provided to electrically connect the plurality of conductor patterns 10 that define the coil Lp1.

As illustrated in FIG. 2, when viewed in the stacking direction, of the sides of the coil Lp1 parallel to the lateral direction (X-direction) of the multilayer body 3, the via conductors 51 and 52 are not provided at the side closer to the first outer electrode 41 and the fourth outer electrode 44, but at the side closer to the conductor patterns 20. In other words, the via conductors 51 and 52 are provided at a position separated from the first outer electrode 41 and the fourth outer electrode 44.

Figure 4:
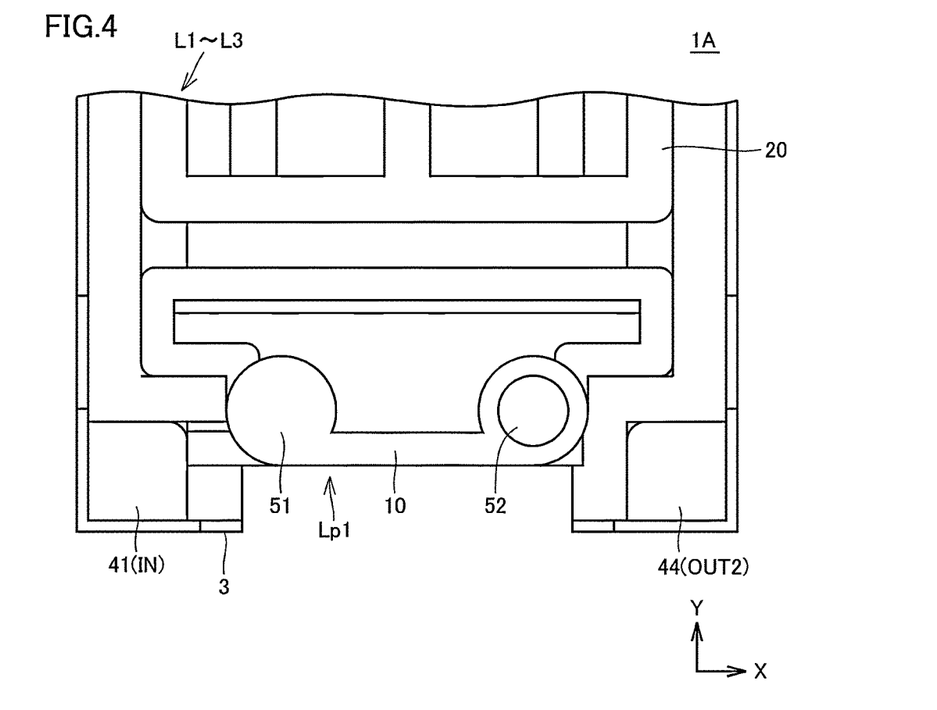
FIG. 4 is a plan view for describing a first coil conductor of a coil component for comparison.
Figure 5:
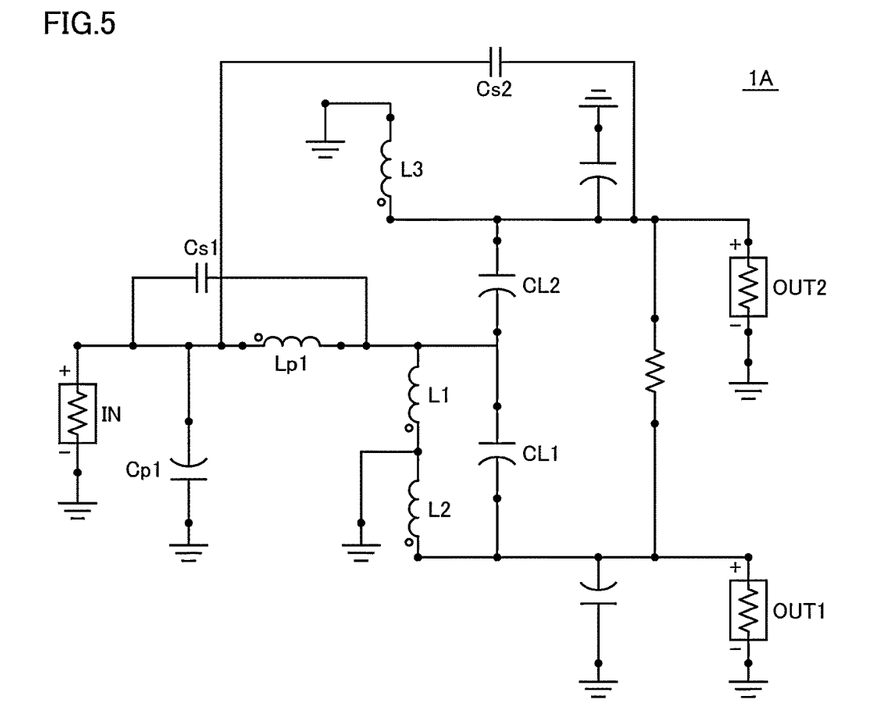
FIG. 5 is an equivalent circuit diagram of the coil component for comparison.

Here, a coil component for comparison, which has a different arrangement of the via conductors 51 and 52, will be described. FIG. 4 is a plan view for describing a first coil conductor of the coil component for comparison. FIG. 5 is an equivalent circuit diagram of the coil component for comparison. A coil component 1A illustrated in FIG. 4 has the via conductors 51 and 52 at the side closer to the first outer electrode 41 and the fourth outer electrode 44. Since the coil component 1A has the same configuration as the coil component 1 illustrated in FIG. 1 except for the positions where the via conductors 51 and 52 are provided, the same symbols are applied to the same configuration and detailed descriptions thereof are not repeated.

In the coil component 1A, as illustrated in FIG. 4, the coil Lp1 of the LC resonator is located adjacent to the first outer electrode 41 and the fourth outer electrode 44, and the via conductors 51 and 52 of the coil Lp1 are located closest to the first outer electrode 41 and the fourth outer electrode 44. When the via conductors 51 and 52 are provided at the side closer to the first outer electrode 41 and the fourth outer electrode 44, a parasitic capacitance Cs1 is generated between the via conductor 51 and the first outer electrode 41 and a parasitic capacitance Cs2 is generated between the via conductor 52 and the fourth outer electrode 44 as illustrated in FIG. 5. The parasitic capacitances Cs1 and Cs2 between the via conductors 51 and 52 and the first outer electrode 41 and the fourth outer electrode 44 cause the isolation characteristics between the output terminals OUT1 and OUT2 of the coil component 1A to deteriorate.

Therefore, in the coil component 1 according to the present preferred embodiment, by providing the via conductors 51 and 52 at positions separated from the first outer electrode 41 and the fourth outer electrode 44, the parasitic capacitances Cs1 and Cs2 generated between the via conductors 51 and 52 and the first outer electrode 41 and the fourth outer electrode 44 are suppressed and the required isolation characteristics are obtained. Specifically, in the coil component 1, when the multilayer body 3 is divided by a bisecting line D into a first region A and a second region B in the longitudinal direction of the multilayer body 3 when viewed in the stacking direction, the coil Lp1 is located in the first region A, as illustrated in FIG. 2. Furthermore, when the coil Lp1 is divided into a conductor of the coil Lp1 closer to the first outer electrode 41 and the fourth outer electrode 44 and a conductor of the coil Lp1 farther from the first outer electrode 41 and the fourth outer electrode 44, at least one of the via conductors 51 and 52 is provided in the conductor of the coil Lp1 farther from the first outer electrode 41 and the fourth outer electrode 44. The positions where the via conductors 51 and 52 are separated from the first outer electrode 41 and the fourth outer electrode 44 may be any position where straight lines l1 and l2 connecting the via conductors 51 and 52 with the first outer electrode 41 and the fourth outer electrode 44 at a minimum distance cross an opening region O of the coil Lp1 when viewed in the stacking direction.

The conductor of the coil Lp1 closer to the first outer electrode 41 and the fourth outer electrode 44 and the conductor of the coil Lp1 farther from the first outer electrode 41 and the fourth outer electrode 44 may be defined as follows. When the coil Lp1 is divided into two equal parts in the longitudinal direction (Y-direction) of the multilayer body 3 when viewed in the stacking direction, as illustrated in FIG. 2, the conductor closer to the first outer electrode 41 and the fourth outer electrode 44 is a first conductor 10A, and the conductor farther from the first outer electrode 41 and the fourth outer electrode 44 is a second conductor 10B.

The coil Lp1 is provided with two via conductors, namely, the via conductors 51 and 52, but is not limited to the case where all via conductors are provided in the second conductor 10B. It is sufficient that at least one of the via conductors 51 and 52 be provided in the second conductor. This allows at least one of the parasitic capacitances Cs1 and Cs2 to be suppressed.

Furthermore, since a magnetic flux flows inside a coil, the Q value of the coil deteriorates if a via conductor is provided inside the coil. However, among the coil Lp1 that does not define a transformer and the coils L1 to L3 that define a transformer included in the coil component 1, even if the Q value of the coil Lp1 that does not define a transformer deteriorates, it does not affect the bandpass characteristics of the LC resonator. Therefore, the via conductors 51 and 52 of the coil Lp1, for which the Q value need not be considered, can be provided inside the coil, thus allowing for a wider area for the coil to be placed within the multilayer body 3. This is particularly effective for the coil component 1 where the coil Lp1 and the coils L1 to L3 are arranged such that they do not overlap within the multilayer body 3.

Next, the configuration of each layer is described using exploded plan views. FIGS. 6A to 6D are first sets of exploded plan views illustrating the configuration of the coil component according to a preferred embodiment of the present invention. FIGS. 7E to 7H are second sets of exploded plan views illustrating a configuration of a coil component according to a preferred embodiment of the present invention. FIGS. 8I to 8L is a third set of exploded plan views illustrating a configuration of a coil component according to a preferred embodiment of the present invention. The coil component 1 is formed by stacking the ceramic green sheets illustrated in the first set of exploded plan views, the second set of exploded plan views, and the third set of exploded plan views in order from the bottom.

First, each of the conductor patterns for coils and capacitors and the electrode patterns for outer electrodes are formed by screen printing of conductive paste (Ni paste) on ceramic green sheets 3a to 3l, which are substrates, as illustrated in FIGS. 6 to 8.

Figure 6A:
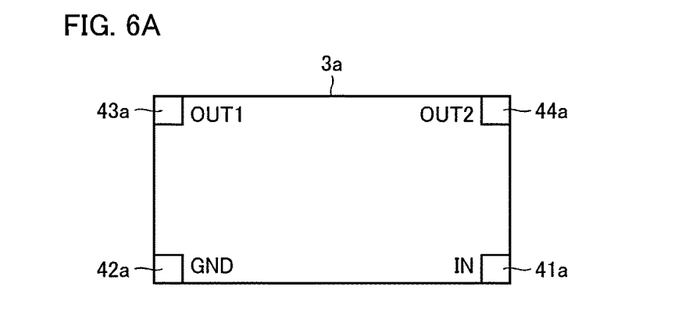
FIGS. 6A to 6D are first sets of exploded plan views illustrating a configuration of a coil component according to a preferred embodiment of the present invention.

The ceramic green sheet 3a includes formed thereon electrode patterns 41a to 44a for the first outer electrode 41 to the fourth outer electrode 44, as illustrated in FIG. 6A.

Figure 6B:
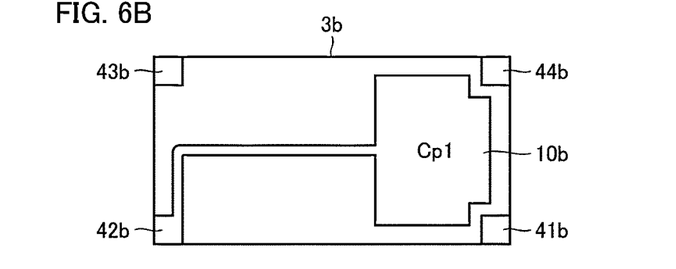

The ceramic green sheet 3b includes thereon electrode patterns 41b to 44b for the first outer electrode 41 to the fourth outer electrode 44, as illustrated in FIG. 6B. Furthermore, the ceramic green sheet 3b includes a conductor pattern 10b, which defines one electrode of the capacitor Cp1, located on the right side of the figure. The conductor pattern 10b includes wiring for electrical connection with the electrode pattern 42b.

Figure 6C:
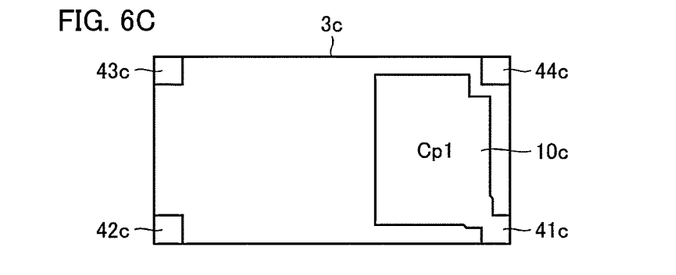

The ceramic green sheet 3c includes thereon electrode patterns 41c to 44c for the first outer electrode 41 to the fourth outer electrode 44, as illustrated in FIG. 6C. Furthermore, the ceramic green sheet 3c has a conductor pattern 10c, which defines the other electrode of the capacitor Cp1, located on the right side of the figure. The conductor pattern 10c is electrically connected to the electrode pattern 41c.

Figure 6D:
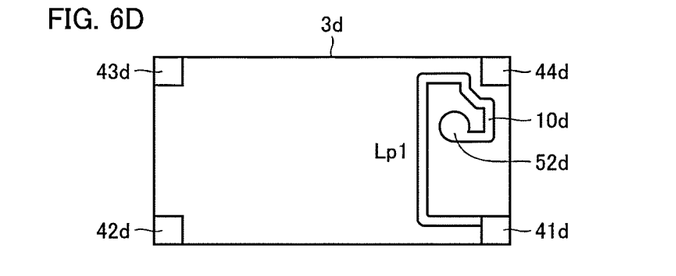

The ceramic green sheet 3d includes thereon electrode patterns 41d to 44d for the first outer electrode 41 to the fourth outer electrode 44, as illustrated in FIG. 6D. Furthermore, the ceramic green sheet 3d includes a conductor pattern 10d, which defines a portion of the coil Lp1, located on the right side of the figure. The conductor pattern 10d is electrically connected at one end to the electrode pattern 41d and is electrically connected at the other end to a connecting portion 52d, which is connected to the via conductor 52.

Figure 7E:
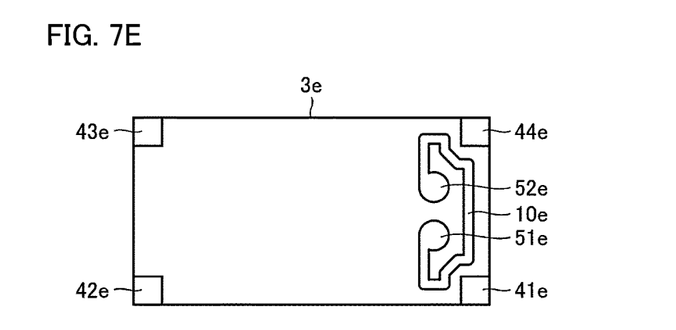
FIGS. 7E to 7H are second sets of exploded plan views illustrating a configuration of a coil component according to a preferred embodiment of the present invention.

The ceramic green sheet 3e includes thereon electrode patterns 41e to 44e for the first outer electrode 41 to the fourth outer electrode 44, as illustrated in FIG. 7E. Furthermore, the ceramic green sheet 3e has a conductor pattern 10e, which defines a portion of the coil Lp1, located on the right side of the figure. The conductor pattern 10e is electrically connected at one end to a connecting portion 51e, which is connected to the via conductor 51, and is electrically connected at the other end to a connecting portion 52e, which is connected to the via conductor 52.

Figure 7F:
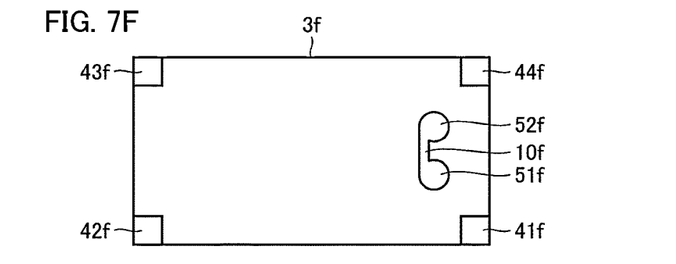

The ceramic green sheet 3f includes thereon electrode patterns 41f to 44f for the first outer electrode 41 to the fourth outer electrode 44, as illustrated in FIG. 7F. In addition, the ceramic green sheet 3f includes a conductor pattern 10f, which defines a portion of the coil Lp1, located on the right side of the figure. The conductor pattern 10f is electrically connected at one end to a connecting portion 51f, which is connected to the via conductor 51, and is electrically connected at the other end to a connecting portion 52f, which is connected to the via conductor 52.

Figure 7G:
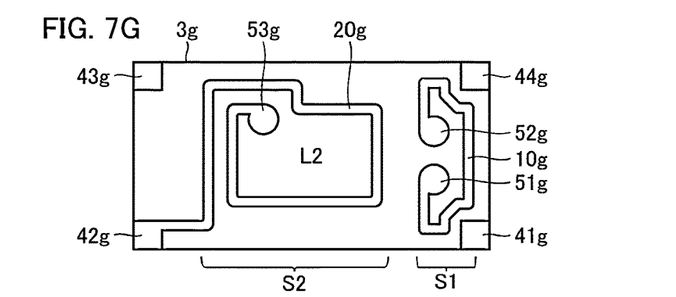

The ceramic green sheet 3g includes thereon electrode patterns 41g to 44g for the first outer electrode 41 to the fourth outer electrode 44, as illustrated in FIG. 7G. In addition, the ceramic green sheet 3g includes a conductor pattern 10g, which defines a portion of the coil Lp1, located on the right side of the figure. The conductor pattern 10g is electrically connected at one end to a connecting portion 51g, which is connected to the via conductor 51, and is electrically connected at the other end to a connecting portion 52g, which is connected to the via conductor 52. Furthermore, the ceramic green sheet 3g includes a conductor pattern 20g, which defines a portion of the coil L2 of the transformer unit, located in the center of the figure. The conductor pattern 20g is electrically connected at one end to the electrode pattern 42g and is electrically connected to a connecting portion 53g at another end, which is connected to a via conductor. When viewed in the stacking direction, a region S1 where the coil Lp1 is provided is narrower than a region S2 where the coil L2 of the transformer unit is provided.

Figure 7H:
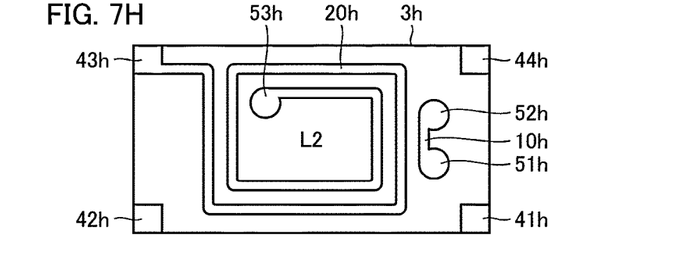

The ceramic green sheet 3h includes thereon electrode patterns 41h to 44h for the first outer electrode 41 to the fourth outer electrode 44, as illustrated in FIG. 7H. In addition, the ceramic green sheet 3h includes a conductor pattern 10h, which defines a portion of the coil Lp1, located on the right side of the figure. The conductor pattern 10h is electrically connected at one end to a connecting portion 51h, which is connected to the via conductor 51, and is electrically connected at the other end to a connecting portion 52h, which is connected to the via conductor 52. Furthermore, the ceramic green sheet 3h has a conductor pattern 20h, which defines a portion of the coil L2 of the transformer unit, located in the center of the figure. The conductor pattern 20h is electrically connected at one end to the electrode pattern 43h and is electrically connected to a connecting portion 53h at another end, which is connected to the via conductor. The conductor pattern 20g and the conductor pattern 20h are electrically connected with the via conductor provided between the connecting portion 53g and the connecting portion 53h to form the coil L2.

Figure 8I:
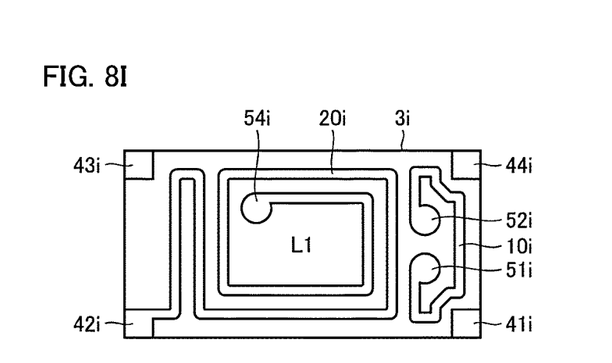
FIGS. 8I to 8L is a third set of exploded plan views illustrating a configuration of a coil component according to a preferred embodiment of the present invention.

The ceramic green sheet 3i includes thereon electrode patterns 41i to 44i for the first outer electrode 41 to the fourth outer electrode 44, as illustrated in FIG. 8I. In addition, the ceramic green sheet 3i has a conductor pattern 10i, which defines a portion of the coil Lp1, located on the right side of the figure. The conductor pattern 10i is electrically connected at one end to a connecting portion 51i, which is connected to the via conductor 51, and is electrically connected at the other end to a connecting portion 52i, which is connected to the via conductor 52. Furthermore, the ceramic green sheet 3i has a conductor pattern 20i, which defines a portion of the coil L1 of the transformer unit, located in the center of the figure. The conductor pattern 20i is electrically connected at one end to the electrode pattern 42i and is electrically connected to a connecting portion 54*i* at another end, which is connected to a via conductor.

Figure 8J:
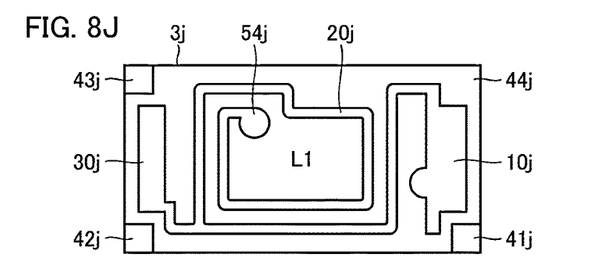

The ceramic green sheet 3*j* includes thereon electrode patterns 41*j* to 44*j* for the first outer electrode 41 to the fourth outer electrode 44, as illustrated in FIG. 8J. In addition, the ceramic green sheet 3*j* includes a conductor pattern 10*j*, which defines one electrode of the capacitor CL2, located on the right side of the figure. In addition, the ceramic green sheet 3*j* has a conductor pattern 30*j*, which defines one electrode of the capacitor CL1, located on the left side of the figure. Furthermore, the ceramic green sheet 3*j* includes a conductor pattern 20*j*, which defines a portion of the coil L1 of the transformer unit, located in the center of the figure. The conductor pattern 20*j* is electrically connected at one end to the conductor pattern 10*j* and the conductor pattern 30*j* and is electrically connected to a connecting portion 54*j* at another end, which is connected to the via conductor. The conductor pattern 20*i* and the conductor pattern 20*j* are electrically connected with the via conductor provided between the connecting portion 54*i* and the connecting portion 54*j* to define the coil L1.

Figure 8K:
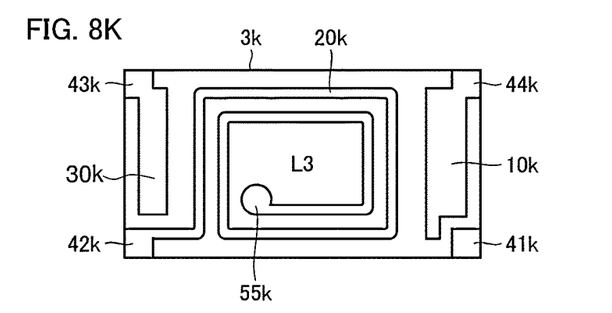

The ceramic green sheet 3*k* includes thereon electrode patterns 41*k* to 44*k* for the first outer electrode 41 to the fourth outer electrode 44, as illustrated in FIG. 8K. In addition, the ceramic green sheet 3*k* includes a conductor pattern 10*k*, which defines the other electrode of the capacitor CL2, located on the right side of the figure. The conductor pattern 10*k* is electrically connected to the electrode pattern 44*k*. In addition, the ceramic green sheet 3*k* includes a conductor pattern 30*k*, which defines the other electrode of capacitor CL1, located on the left side of the figure. The conductor pattern 30*k* is electrically connected to the electrode pattern 43*k*. Furthermore, the ceramic green sheet 3*k* includes a conductor pattern 20*k*, which defines a portion of the coil L3 of the transformer unit, located in the center of the figure. The conductor pattern 20*k* is electrically connected at one end to the electrode pattern 42*k* and is electrically connected to a connecting portion 55*k* at another end, which is connected to a via conductor.

Figure 8L:
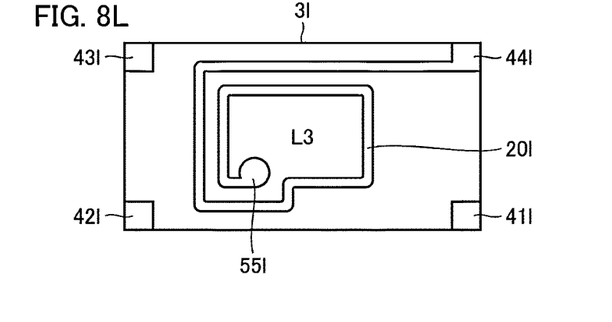

The ceramic green sheet 3*l* includes thereon electrode patterns 41*l* to 44*l* for the first outer electrode 41 to the fourth outer electrode 44, as illustrated in FIG. 8L. Furthermore, the ceramic green sheet 3*l* includes a conductor pattern 20*l*, which defines a portion of the coil L3 of the transformer unit, located in the center of the figure. The conductor pattern 20*l* is electrically connected at one end to the electrode pattern 44*l* and is electrically connected to a connecting portion 55*l* at another end, which is connected to the via conductor. The conductor pattern 20*k* and the conductor pattern 20*l* are electrically connected with the via conductor between the connecting portion 55*k* and the connecting portion 55*l* to define the coil L3. The coils L1 to L3 define a transformer including a plurality of coils stacked in the stacking direction.

The first outer electrode 41 is formed by electrically connecting the electrode patterns 41*a* to 41*l* on the ceramic green sheet 3*a* to the ceramic green sheet 3*l*. Similarly, the second outer electrode 42 is formed by electrically connecting the electrode patterns 42*a* to 42*l* on the ceramic green sheet 3*a* to the ceramic green sheet 3*l*. The third outer electrode 43 is formed by electrically connecting the electrode patterns 43*a* to 43*l* on the ceramic green sheet 3*a* to the ceramic green sheet 3*l*. The fourth outer electrode 44 is formed by electrically connecting the electrode patterns 44*a* to 44*l* on the ceramic green sheet 3*a* to the ceramic green sheet 3*l*.

In the coil component 1, at least one ceramic green sheet is stacked as each of the plurality of ceramic green sheets 3*a* to 3*l* illustrated in FIG. 3, and a plurality of ceramic green sheets with no conductor pattern printed thereon (dummy layers) are also stacked on both the top and bottom surfaces thereof. The plurality of ceramic green sheets, including the dummy layers, are pressure-bonded together to define an unbaked multilayer body 3 (ceramic element). The multilayer body 3 is baked, and copper electrodes are baked on the outside of the baked multilayer body 3 so as to be electrically connected to the first outer electrode 41 to the fourth outer electrode 44.

As described above, the coil component 1 according to the present preferred embodiment includes a plurality of coils in a multilayer body 3 having a rectangular or substantially rectangular parallelepiped shape. The coil component 1 includes a first outer electrode 41 to a fourth outer electrode 44 provided at least partially at side surfaces of the multilayer body 3, a coil Lp1 with a winding axis extending in the stacking direction of the multilayer body 3, and coils L1 to L3 with a winding axis extending in the stacking direction and located at a position where the coils L1 to L3 do not overlap the coil Lp1 when viewed in the stacking direction. The coil Lp1 includes a plurality of conductor patterns 10*d* to 10*i* stacked with an insulating layer interposed therebetween and via conductors 51 and 52 to electrically connect the plurality of conductor patterns 10*d* to 10*i*. When the multilayer body 3 is divided by a bisecting line D into a first region A and a second region B in the longitudinal direction of the multilayer body 3 when viewed in the stacking direction, the coil Lp1 is located in the first region A. When viewed in the stacking direction, straight lines I1 and I2 connecting the via conductors 51 and 52 with the first outer electrode 41 and the fourth outer electrode 44 at a minimum distance cross the opening region O of the coil Lp1.

As a result, when the coil component 1 according to the present preferred embodiment is viewed in the stacking direction, the straight lines I1 and I2 connecting the via conductors 51 and 52 with the first outer electrode 41 and the fourth outer electrode 44 at a minimum distance cross the opening region O of the coil Lp1, thus separating the via conductors 51 and 52 from the first outer electrode 41 and the fourth outer electrode 44. The parasitic capacitance generated between the coil Lp1 and the first outer electrode 41 and the fourth outer electrode 44 can be suppressed, and the characteristics required for the coil component 1 (e.g., isolation characteristics between the output terminals OUT1 and OUT2) can be obtained.

It is preferred that the conductor closer to the first outer electrode 41 and the fourth outer electrodes 44 be the first conductor 10A, the conductor farther from the first outer electrode 41 and the fourth outer electrode 44 be the second conductor 10B, and at least one of the via conductors 51 and 52 be provided in the second conductor 10B. This allows the parasitic capacitance generated between the coil Lp1 and the first outer electrode 41 and the fourth outer electrode 44 to be suppressed and the characteristics required for the coil component 1 to be obtained.

At least one of the via conductors 51 and 52 is preferably provided at a side of the coil Lp1 parallel to the lateral direction of the multilayer body 3 when viewed in the stacking direction. This can suppress parasitic capacitance generated between the coil Lp1 and the first outer electrode 41 and the fourth outer electrode 44.

The via conductors 51 and 52 are preferably provided inside the coil Lp1. This allows for a wider area for the coil Lp1 and the coils L1 to L3 to be placed within the multilayer body 3.

When viewed in the stacking direction, the region S1 where the coil Lp1 is provided is preferably narrower than the region S2 where the coils L1 to L3 are provided. This allows for a wider area for the transformer unit to be placed within the multilayer body 3.

The coils L1 to L3 preferably define a transformer including a plurality of coils stacked in the stacking direction. This allows for a divider circuit in which the coil Lp1, which does not define a transformer, and the coils L1 to L3, which define a transformer, are arranged adjacent to each other.

The plurality of outer electrodes are preferably the first outer electrode 41 to the fourth outer electrode 44 located at the four corners of the multilayer body 3. This allows the plurality of outer electrodes at the four corners of the multilayer body 3 to be electrically connected to the outside. Modifications In the coil component 1 described so far, the transformer unit has been described as including three coils L1 to L3 stacked in the stacking direction, but it may include two or more coils stacked in the stacking direction.

The coil component 1 described so far has been described as including a multilayer body 3 (ceramic body) including a plurality of stacked ceramic layers, but may have any dielectric multilayer structure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil component comprising:
    a plurality of coils in a multilayer body with a rectangular or substantially rectangular parallelepiped shape;
    an outer electrode located at least partially at a side surface of the multilayer body;
    a first coil conductor including a winding axis extending in a stacking direction of the multilayer body; and
    a second coil conductor including a winding axis extending in the stacking direction and located at a position where the second coil conductor does not overlap the first coil conductor when viewed in the stacking direction; wherein
    the first coil conductor includes:
        a plurality of conductor patterns stacked with an insulating layer interposed therebetween; and
        a connecting conductor to electrically connect the plurality of conductor patterns;
    when the multilayer body is divided by a bisecting line into a first region and a second region in a longitudinal direction of the multilayer body when viewed in the stacking direction, the first coil conductor is located in the first region; and
    when viewed in the stacking direction, a straight line connecting the connecting conductor with the outer electrode at a minimum distance crosses an opening region of the first coil conductor.

2. The coil component according to claim 1, wherein
    a conductor closest to the outer electrode is a first conductor and a conductor farther from the outer electrode than the first conductor is a second conductor; and
    the connecting conductor includes at least one connecting conductor provided in the second conductor.

3. The coil component according to claim 1, wherein the connecting conductor includes at least one connecting conductor provided at a side of the first coil conductor parallel to a lateral direction of the multilayer body when viewed in the stacking direction.

4. The coil component according to claim 1, wherein the connecting conductor is provided inside the first coil conductor.

5. The coil component according to claim 1, wherein a region where the first coil conductor is located is narrower than a region where the second coil conductor is located when viewed in the stacking direction.

6. The coil component according to claim 1, wherein the second coil conductor defines a transformer including a plurality of coils stacked in the stacking direction.

7. The coil component according to claim 1, wherein the outer electrode includes first, second, third, and fourth outer electrodes at four corners of the multilayer body.

8. The coil component according to claim 1, wherein the coil component defines a divider circuit.

9. The coil component according to claim 1, wherein the multilayer body includes an LC resonator therein.

10. The coil component according to claim 1, wherein the multilayer body includes via conductors spaced from the outer electrode.

11. The coil component according to claim 7, wherein the multilayer body includes via conductors spaced from the first outer electrode and the fourth outer electrode.

12. The coil component according to claim 1, wherein at least one of the plurality of coils includes two via conductors.

13. The coil component according to claim 1, wherein the multilayer body includes two via conductors inside of one of the plurality of coils.

14. The coil component according to claim 1, wherein the plurality of coils includes first coils defining a transformer and a second coil not defining a transformer adjacent to each other.

15. The coil component according to claim 1, wherein a number of the plurality of coils is two or more.

16. The coil component according to claim 1, wherein a number of the plurality of coils is three.

17. The coil component according to claim 1, wherein the multilayer body includes a plurality of stacked ceramic layers.

* * * * *